US006886145B2

United States Patent
Davidson et al.

(10) Patent No.: US 6,886,145 B2
(45) Date of Patent: Apr. 26, 2005

(54) REDUCING VERIFICATION TIME FOR INTEGRATED CIRCUIT DESIGN INCLUDING SCAN CIRCUITS

(75) Inventors: Scott Davidson, Fremont, CA (US); Ramesh C. Tekumalla, Malden, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 205 days.

(21) Appl. No.: 10/201,711

(22) Filed: Jul. 22, 2002

(65) Prior Publication Data

US 2004/0015798 A1 Jan. 22, 2004

(51) Int. Cl.[7] .............................................. G06F 17/50
(52) U.S. Cl. ....................... 716/6; 716/4; 716/7; 716/12
(58) Field of Search .............................. 716/4, 6, 7, 12, 716/5; 703/14, 19

(56) References Cited

U.S. PATENT DOCUMENTS

| | | | |
|---|---|---|---|
| 5,452,239 A | * | 9/1995 | Dai et al. ..................... 703/19 |
| 5,787,006 A | | 7/1998 | Chevallier et al. ........... 364/488 |
| 5,864,487 A | | 1/1999 | Merryman et al. .......... 364/491 |
| 5,917,729 A | | 6/1999 | Naganuma et al. ......... 364/491 |
| 6,367,042 B1 | | 4/2002 | Phan et al. .................. 714/733 |
| 6,457,162 B1 | * | 9/2002 | Stanion ........................ 716/7 |
| 6,611,947 B1 | * | 8/2003 | Higgins et al. ................ 716/5 |

* cited by examiner

Primary Examiner—Thuan Do
(74) Attorney, Agent, or Firm—Gunnison, McKay & Hodgson, L.L.P.

(57) ABSTRACT

A testbench for an integrated circuit (IC) design including a chain of scan circuits having a memory characteristic is verified by: (a) dividing the chain of scan circuits and creating a plurality of partitions, each partition including at least one logic cone output, each scan circuit belonging to one of the partition as a logic cone output; (b) generating a partitioned netlist for each partition from a full netlist for the IC design, the partitioned netlist including at least one logic cone, the logic cone extending from the logic cone output to at least one logic cone input; (c) generating a partitioned testbench for each partition from the full testbench based on the partitioned netlists; and (d) performing verification for the testbench by simulating the partitioned testbenches on the corresponding partitioned netlists.

5 Claims, 7 Drawing Sheets

| Partition | Simulation Time(secs) | Speedup | Number of Events | Improvement |
|---|---|---|---|---|
| 1 | 1970.7 | 14.86 | 1358507564 | 1.11 |
| 2 | 564.5 | 51.88 | 347428936 | 4.36 |
| 3 | 369.4 | 79.28 | 157318568 | 9.63 |
| 4 | 429.6 | 68.17 | 191313668 | 7.92 |
| 5 | 424.2 | 69.03 | 186260377 | 8.13 |
| 6 | 373.8 | 78.34 | 162392891 | 9.33 |
| 7 | 372.8 | 78.55 | 162400489 | 9.33 |
| 8 | 416.8 | 70.26 | 190430439 | 7.95 |
| 9 | 417.5 | 70.14 | 192739385 | 7.86 |
| 10 | 399.9 | 73.23 | 173476011 | 8.73 |
| 11 | 1064.3 | 27.51 | 726596738 | 2.08 |
| 12 | 1621.7 | 18.06 | 1218419395 | 1.24 |
| 13 | 1299.9 | 22.53 | 990060907 | 1.53 |
| 14 | 1004.4 | 29.16 | 679417896 | 2.23 |
| 15 | 1768.5 | 16.56 | 1289172019 | 1.17 |
| 16 | 1523 | 19.23 | 1126054671 | 1.34 |
| 17 | 649.3 | 45.1 | 393491193 | 3.85 |
| 18 | 2019.5 | 14.5 | 1411369569 | 1.07 |
| 19 | 1669.5 | 17.54 | 1278294260 | 1.18 |
| 20 | 528.1 | 55.45 | 303020099 | 5 |
| 21 | 1535.8 | 19.07 | 1174520971 | 1.29 |
| 22 | 500 | 58.57 | 182013590 | 8.32 |
| 23 | 350.9 | 83.45 | 128097577 | 11.82 |
| 24 | 565.1 | 51.82 | 256855094 | 5.9 |
| 25 | 381.3 | 76.8 | 159118717 | 9.52 |
| 26 | 494.2 | 59.26 | 226406835 | 6.69 |
| 27 | 396.7 | 73.58 | 163576209 | 9.26 |
| 28 | 403 | 72.67 | 173141258 | 8.75 |
| 29 | 554 | 52.86 | 239884487 | 6.31 |
| 30 | 377.9 | 77.49 | 156861183 | 9.65 |
| Average | | 51.47 | | 5.75 |

FIG. 8

REDUCING VERIFICATION TIME FOR INTEGRATED CIRCUIT DESIGN INCLUDING SCAN CIRCUITS

FIELD OF THE INVENTION

The present invention relates to verification for integrated circuit (IC) designs. More particularly, the present invention relates to a method and apparatus for verifying a testbench for an IC design including a chain of scan circuits.

BACKGROUND OF THE INVENTION

Integrated circuits are tested for manufacturing defects by applying a set of stimuli, called test vectors to the circuits. These test patterns can be applied from an external piece of Automatic Test Equipment (ATE), or they can be generated internally through use of Built-In Self-Test (BIST). Externally applied test patterns may be created by an Automatic Test Pattern Generation (ATPG) tool. The BIST is an on-chip tester that creates a set of test patterns corresponding to signals that will be generated on-chip for analysis of fault coverage and for verification.

ATPG and BIST tools also create a set of expected responses (output patterns) of the circuit under the test (CUT) as a function of the input stimuli. Typically, circuit models and libraries used by ATPG and BIST tools for generating the expected patterns are different from those used in designing the circuit. The ATE or on-chip hardware use the expected patterns to check that the CUT is performing correctly. Thus, if the expected responses are incorrect, every IC fabricated will fail the verification test by the BIST or ATE even if the IC operates correctly. Therefore, the expected responses should be verified for correctness the same logic simulation tool used to verify the functional correctness of the IC design.

The ATPG and BIST tools create a testbench to support this verification process. A testbench is a correction of input values (input vector) and expected output values (output vector). The testbench applies the generated input vectors to the circuit design (a simulation model of the circuit), and checks the responses. The testbench is simulated by a logic simulator, the results are compared with the expected values, and any mismatches discovered are corrected before finalizing the netlist of the design.

The Design for Testability (DFT) tools create two kinds of testbenches: parallel testbench and serial testbench. A parallel testbench involves setting the state of each memory element such as flip-flop or latch in a design before application of a test vector. This shortens verification time somewhat, but does not reflect the actual methodology used to test the IC in production. A serial testbench receives the test pattern only form the primary inputs of the design, and provides a complete and accurate simulation of the workings of the test circuitry.

A parallel testbench simulation takes a long time, for example, several hours to a day, or a day to several weeks, depending on the size of the design, the speed of the computers running the simulation, the speed of the simulator used, and the like. A serial testbench simulation takes even longer. Thus, since a full serial simulation is impractical, the current standard procedure is to simulate a few vectors to test the workings of the basic DFT logic, and then simulate the full vector set using parallel simulation. However, this verification procedure is still barely tolerable for ASIC designs, and the verification is a major bottleneck for microprocessor designs.

The long verification time imposes a significant burden on design schedule to achieve a required short time-to-market, whereas not performing the full verification process increases the risk of errors in the completed IC design. In addition, some designs are not amenable to parallel simulation, and some microprocessor designs cannot be verified using parallel testbenches because of the name space mismatch between the ATPG model and the golden simulation model. Furthermore, increasing IC sizes worsen the situation, since there are more vectors to verify, and more verification time per vector is required.

BRIEF DESCRIPTION OF THE INVENTION

A testbench for an integrated circuit (IC) design including a chain of scan circuits having a memory characteristic is verified by: (a) dividing the chain of scan circuits and creating a plurality of partitions, each partition including at least one logic cone output, each scan circuit belonging to one of the partition as a logic cone output; (b) generating a partitioned netlist for each partition from a full netlist for the IC design, the partitioned netlist including at least one logic cone, the logic cone extending from the logic cone output to at least one logic cone input; (c) generating a partitioned testbench for each partition from the full testbench based on the partitioned netlists; and (d) performing verification for the testbench by simulating the partitioned testbenches on the corresponding partitioned netlists.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 8 is a diagram in a tabular form showing a result of the parallel testbench partitioning and verification performed on a circuit block of an application specific integrated circuit in accordance with one embodiment of the present invention.

DETAILED DESCRIPTION

Figure 1:
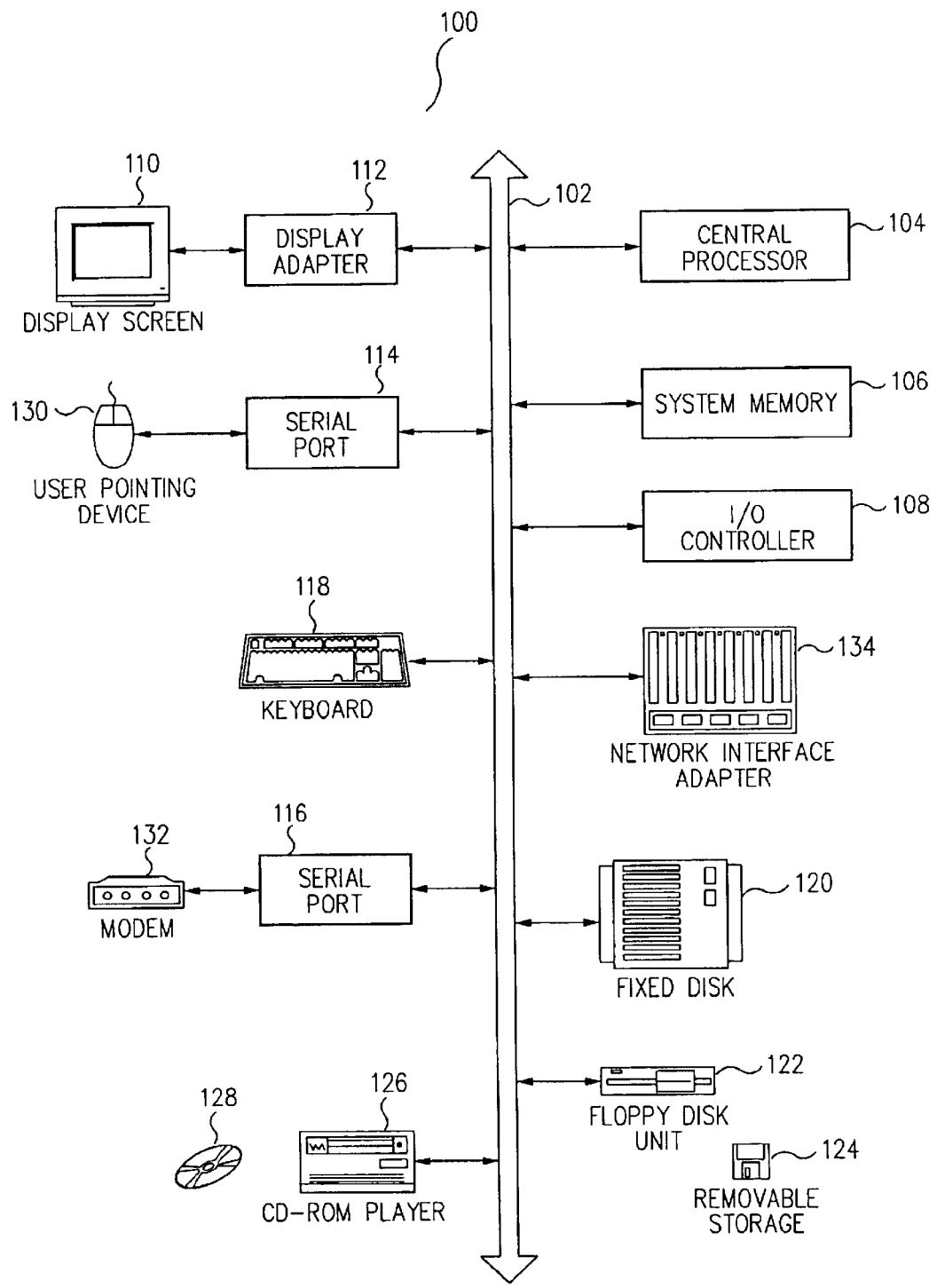
FIG. 1 is a block diagram schematically illustrating a computer system suitable for implementing aspects of the present invention.

Embodiments of the present invention are described herein in the context of reducing verification time for an integrated circuit (IC) design including scan circuits. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available from Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

FIG. 1 depicts a block diagram of a computer system 100 suitable for implementing aspects of the present invention. As shown in FIG. 1, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 1 to be present to practice the present invention, as discussed below. Furthermore, the devices and subsystems may be interconnected in different ways from that shown in FIG. 1. The operation of a computer system such as that shown in FIG. 1 is readily known in the art and is not discussed in detail in this application, so as not to overcomplicate the present discussion. Code to implement the present invention may be operably disposed in system memory 106 or stored on storage media such as fixed disk 120, floppy disk 124 or CD-ROM 128.

Figure 2:
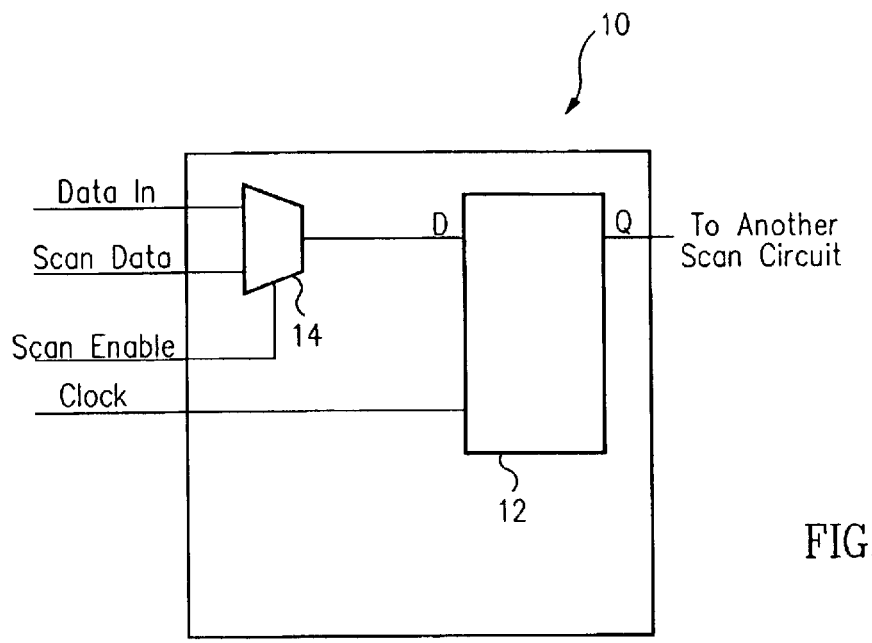
FIG. 2 is a diagram schematically illustrating a scan circuit inserted in an IC design by a design-for-testability tool in accordance with one embodiment of the present invention.

FIG. 2 schematically illustrates a scan circuit 10 inserted in an IC design by a DFT tool in accordance with one embodiment of the present invention. The scan circuit 10 may be a scan flip-flop, latch, or other circuit having a memory characteristic (memory element). Both BIST and ATPG tools assume that the circuit is fully scanable. Scan design, or scan-path design involves changing each memory element (typically, flip-flop) in the IC design into a scan circuit. As shown in FIG. 2, a scan circuit 10 includes two additional inputs: Scan Data (SD) and Scan Enable (SE), in addition to the conventional inputs of Data In (DI) and Clock (CLK), and a data output (Q). In this example, the scan circuit 10 includes a flip-flop 12 and a multiplexer 14 for selectively supplying one of the functional data input (DI) and the scan data input (SD) to the flip-flop 12.

The SD input of each scan circuit is connected to an output (Q) of another scan circuit to form a scan chain. The SE input selects between the functional data input (DI) and the scan input (SD). When the SE input is set to scan mode (i.e., a SE signal is asserted), the scan circuits (typically flip-flops) are configured into one or more shift registers. These shift registers are used to set the state of the scan circuits to have a desired initial value for the test, and then to capture and scan out the results of applying the test vector. This converts the sequential circuit test pattern generation problem, which is extremely complex and difficult, into a much easier combinational test pattern generation problem. When BIST is used, the scan design creates a combinational circuit which can be effectively tested with random test patterns. When the scan circuit is not in the scan mode, it receives signals at the data input (DI) and operates as an ordinary memory element in the circuit.

Figure 3:
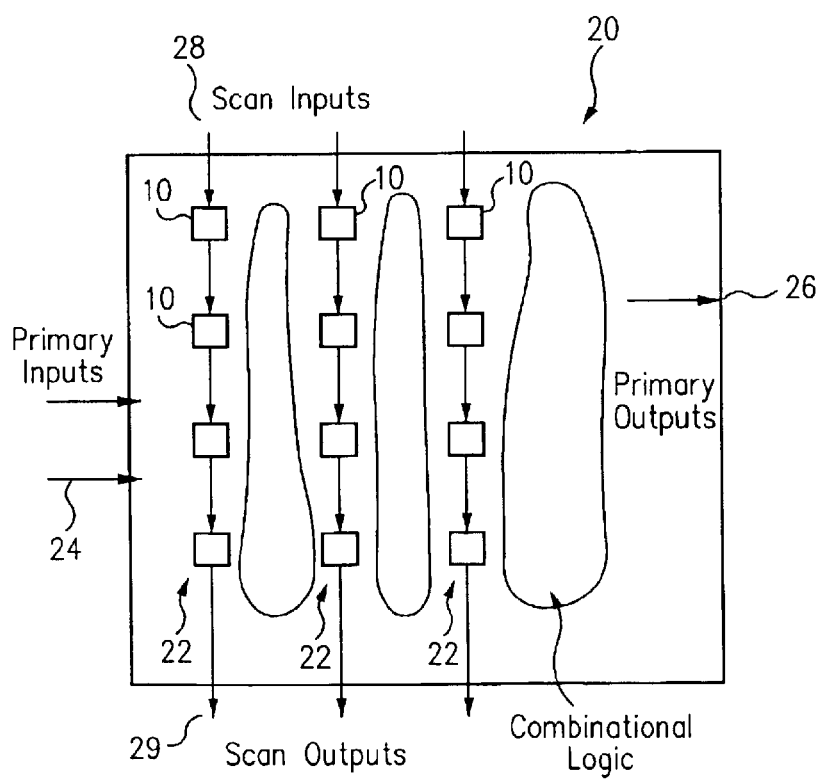
FIG. 3 is a diagram schematically illustrating an example of an IC design including at least one chain of scan circuits.

FIG. 3 schematically illustrates an example of an IC design ("scanned" circuit) 20 including at least one chain of scan circuits. The circuit 20 receives primary inputs 24 and produces primary outputs 26. Each of the scan chains 22, which is coupled with primary inputs 24 and primary outputs 26, is configurable. A scan test is done in the following manner.

First, the Scan Enable input (FIG. 2) to each of the scan circuits 10 is set to scan mode so that a set of scan circuits 10 is configured into a scan chain 22. Values for the test of the circuit 20 are first placed at the inputs of each scan chain 22 (scan inputs 28), and then the circuit 20 is clocked so that the desired values are shifted into the scan chains 22. This shift-in (or scan-in) operation takes a number of clocks equal to the length of the longest scan chain 22 in the circuit 20, which typically includes thousands or tens of thousands of scan circuits. When all of the values are shifted in each scan chain 22, the SE signal is de-asserted so as to configure each scan circuit 10 into a normal operation mode. That is, the scan chain 22 is de-configured and the each scan circuit 10 is ready to receive a data signal to its data input, instead of the scan data.

Then, appropriate input values are placed on the primary inputs 24, and the circuit 20 is clocked again. Each scan circuit 10 receives input data from the primary inputs 24 and/or from other scan circuits 10 whose values have been set during the scan-in in procedure, capturing the results of the test. Then, the SE signal is asserted so as to re-form the scan chains 22, and the results of the test are scanned out from the scan chain 22 by clocking the circuit 20. The scanned-out results (a series of the Q outputs of the scan circuits 10) are compared with the expected results, and the primary outputs 29 of the circuit 20 are also compared with the expected values of the design. Any mismatches of the tested values and the expected values are reported, and then the next test vector is processed. Typically, a set of the next test values are scanned into the scan chains 22 while the previous test results are scanned out.

In a parallel testbench, Verilog force statements are used to force the scan inputs of the scan circuits to the values to be received after a scan-shift operation is done except the final shift clock. After the force statements, another clock is used to capture the forced value into the scan circuits. That is, in the parallel testbench, the scan chains are loaded with the desired values without the actual shift-in operation of the hardware. Similarly, the output values of the scan circuits can be immediately compared with the expected values in the parallel testbench, without the actual scan-out operation.

As described above, the verification of the entire testbench includes the independent verification of the values captured by each scan circuit and each primary output. The applicants realized that since the scan-shift (i.e., sequentially setting the values into the scan chains) is not simulated while running a parallel testbench, each scan circuit can be considered separately. If all scan circuit outputs (captured values) and primary outputs match their respective expected values, the entire testbench is verified. Thus, in accordance with one embodiment of the present invention, the testbench is partitioned into a plurality of partitioned testbenches for verification.

The expected value of each of the scan circuits 10 can be completely specified by simulating a corresponding cone of logic (logic cone) which has the scan circuit 10 as its "tip" (i.e., the output of the logic). A "logic cone" is defined with its output (logic cone output), and then traced back to the logic gates driven/controlled by the input vectors (i.e., logic cone inputs). The logic cone extends from the logic cone output to one or more logic cone inputs, and includes all logic between the traced-back logic cone input(s) and the logic cone output. Typically, a logic cone includes combinational logic between the logic input(s) and the logic cone output. However, a logic cone may also include a limited amount of sequential logic so long as the sequential logic is not scanned during the verification. The expected value of each of the primary outputs 26 is also determined by simulating the logic cone having the primary output as its cone output.

Figure 4:
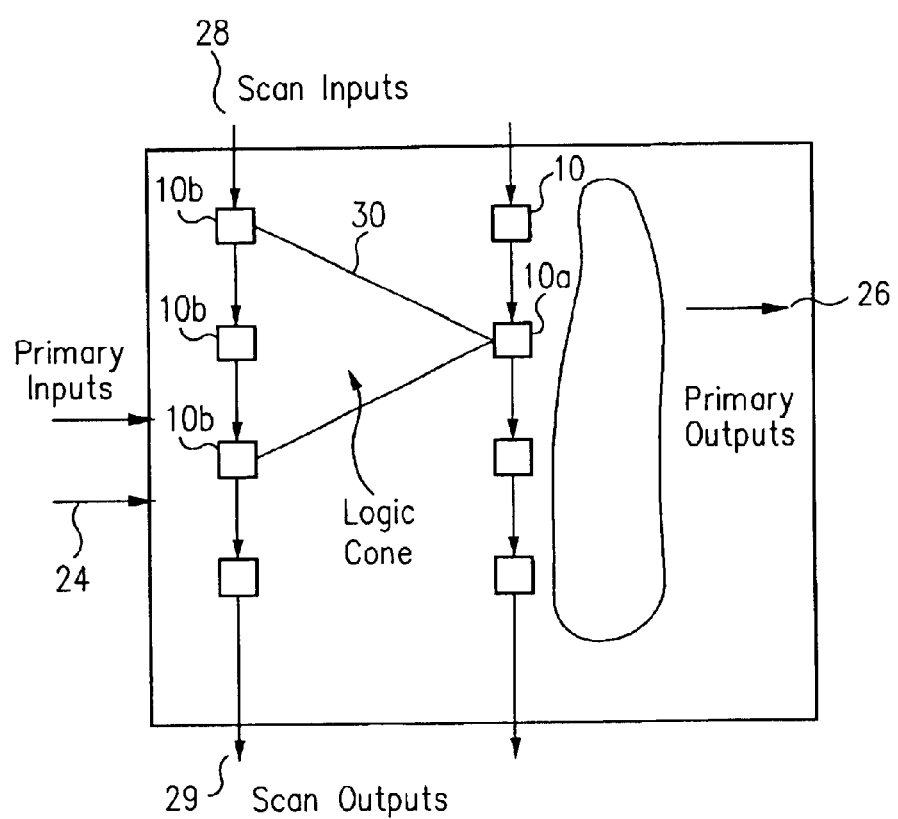
FIG. 4 is a diagram schematically illustrating an example of a logic cone in an IC design in accordance with one embodiment of the present invention.
Figure 5:
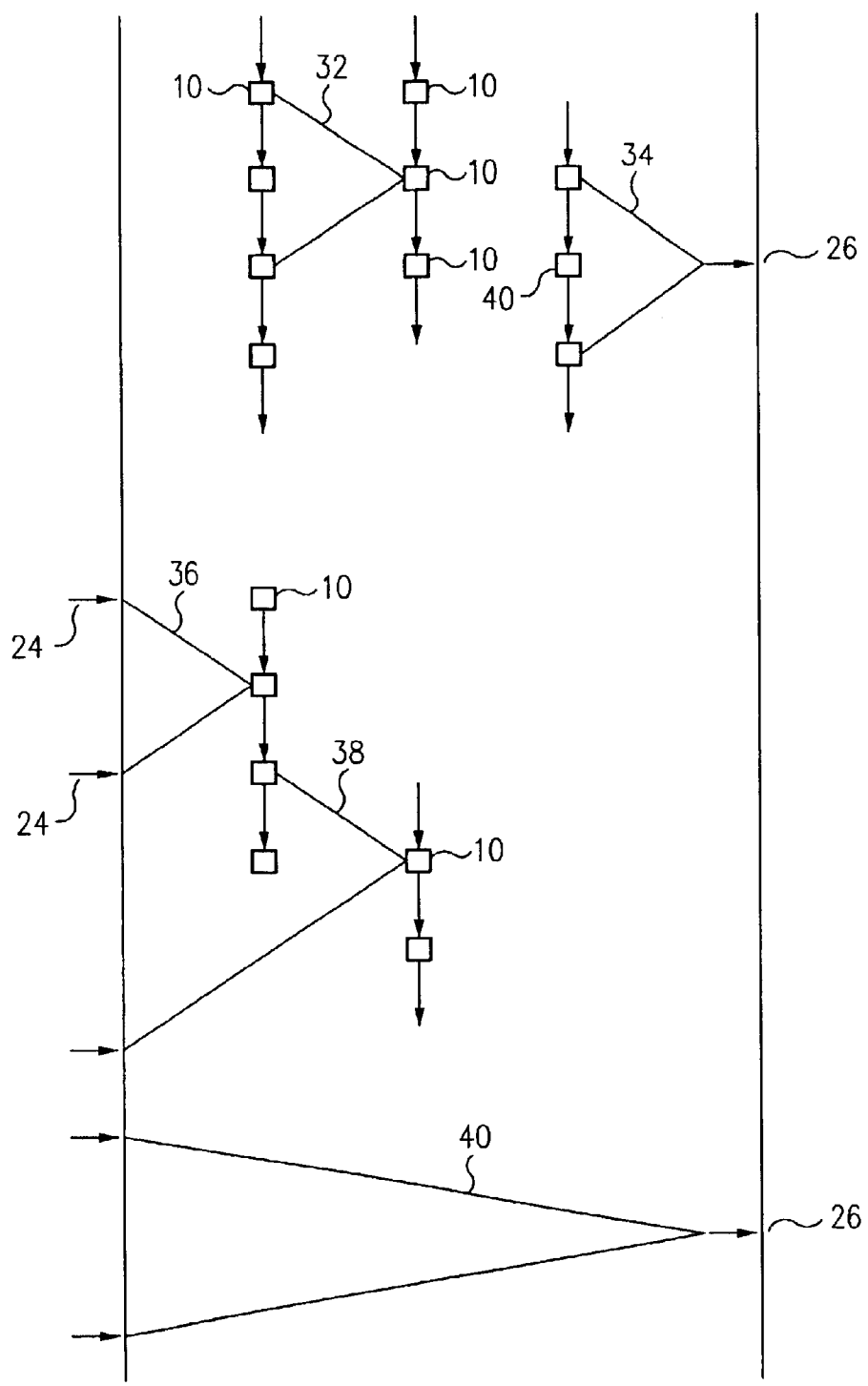
FIG. 5 is a diagram schematically illustrating various examples of logic cones in an IC design in accordance with one embodiment of the present invention.

FIG. 4 schematically illustrates an example of a logic cone 30 in the IC design. In this example, the logic cone 30 extends from the D input (see FIG. 2) of a scan circuit 10*a* to a logic gate, i.e., the Q output of another scan circuit 10*b* which has an assigned value. FIG. 5 schematically illustrates various logic cones 32–40 in accordance with one embodiment of the present invention. A logic cone 32 is of the same type as logic cone 30 having scan circuits 10 as both the logic cone output and the logic cone inputs. A logic cone 34 has a primary output 26 as its logic cone output. Similarly, logic cones 36 and 38 have one or more scan circuits 10 and/or the primary inputs 24 as their logic cone inputs. Also, a logic cone 40 may be formed between the primary inputs 24 and the primary outputs 26. It should be noted that FIG. 5 does not show all of the scan circuits 10 for simplicity.

In a functional simulation of the IC circuit, logic cones are very large since only primary inputs can be controlled as the logic cone inputs. In a scan simulation using a parallel testbench, however, since each scan circuit 10 with a controlled value is considered as a pseudo-primary input, the tracing-back process to determine a logic cone can be terminated at scan circuits. This can make the logic cone to be simulated purely combinational in most cases. Any logic paths not ending in scan circuits 10 will eventually be traced back to the primary inputs 24, which are also added to the logic cone, as described above.

Accordingly, if values at all of the logic cone inputs of a logic cone, i.e., values at the corresponding scan circuits (and primary inputs, if any) are extracted, the correctness of the scan test for the corresponding output scan circuit is verified by applying a small subset of the entire testbench onto that specific logic cone. Since each scan circuit can be tested independently, the simulation process can be significantly parallelized. Theoretically, if there were n scan circuits in a circuit design, the verification can be performed by n smaller verification runs. That is, each partition of the scan chain may contain a single logic cone traced back form one scan circuit. However, for practical reasons, the scan chain may be divided into larger partitions, for example, depending on a computing environment. Single-scan circuit partitions may be created, however, and can be useful, especially when debugging mismatches in the verification results.

Figure 6:
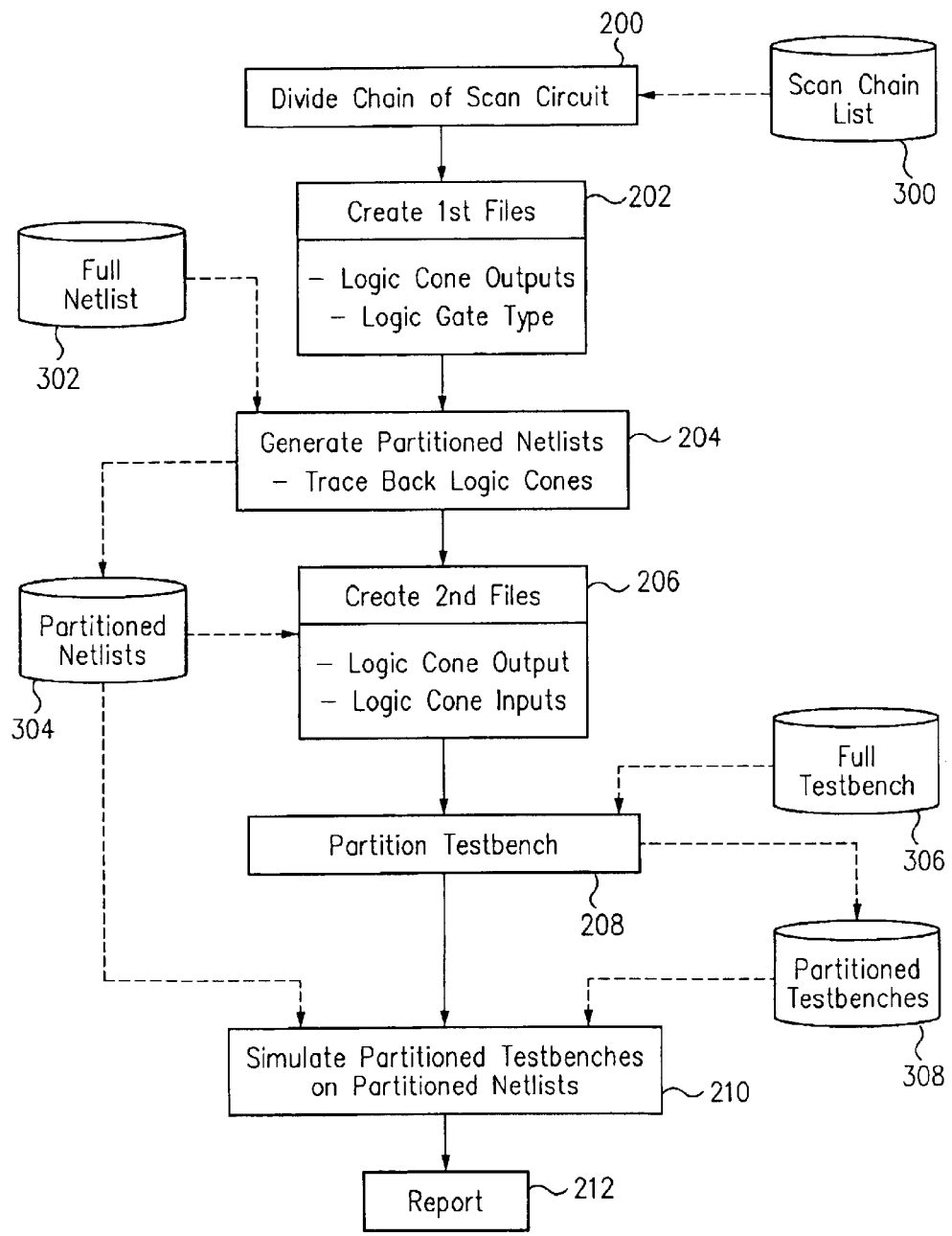
FIG. 6 is a process flow diagram schematically illustrating a method for verifying a testbench in accordance with one embodiment of the present invention.

FIG. 6 schematically illustrates a method for verifying a testbench in accordance with one embodiment of the present invention. As described above, the IC design includes a chain of scan circuits having a memory characteristic. As shown in FIG. 6, the chain of scan circuits is divided so as to create a plurality of partitions (200). In accordance with one embodiment of the present invention, the scan chain is divided such that each partition includes substantially the same number of scan circuits. However, the scan chain may be divided such that each partition includes a substantially equal number of logic gates. The division of the scan chain may use a list of the scan chain 300 or any other file containing information of the scan chains and identification of each scan circuits. Such a list or file may be produced using a design for testability (DFT) tool.

In general, each of the partitions includes at least one logic cone output, and each scan circuit belongs to one of the partitions as a logic cone output. This means that although the chain of scan circuits is divided into partitions and thus a typical partition includes at least one scan circuit, there may be partitions that include no scan circuit as a logic cone output when the logic cone output is a primary output of the IC.

Next, a partitioned netlist is generated for each of the partitions from the full netlist 302 for the IC design (204). Each of the partitioned netlists includes at least one logic cone, and typically a set of logic cone netlists for the scan circuits included in the partition. The partitioned netlists 304 may be created using an electronic design automation (EDA) tool, and stored in a database.

Generating the partitioned netlists includes creating logic cones for each partition. As described above, this involves tracing back from the logic cone output to its input gates. In accordance with one embodiment of the present invention, the tracing back process is based on information of an output of each logic cone (logic cone output) within the partition, and information of a specific type of logic gates defining a logic cone input. The information of the logic cone outputs may include a list of output signals of the scan circuits and/or a list of primary outputs within the partition. The specific type of the logic gates may be the logic gate of scan circuits, and the logic cone input information may also include primary inputs. An input file (first file) containing the information may be created for each partition (202). That is, if there are n number of partitions, n first files are created. The following process may be performed for a partition at a time.

Since a logic cone is defined with its output signal, a logic gate (first logic gate) for which the output signal is an output is first determined. Then, an input signal of the first logic gate is traced back to a second logic gate driving the input signal. This tracing back is recursively repeated until the input signal to the second logic gate is a primary input to the IC design, or a third logic gate driving the input signal to the second logic gate is of the specific type (typically, that of the scan circuit). Then, all of the logic gates and signals traced back from the first logic gate to the primary input or to the logic gate of the specific type are collected to form a logic cone (cone netlist). This process is performed on all cone output signals so as to obtain all logic cones in the partition.

Then, the testbench is partitioned so as to generate a partitioned testbench for each partition (208). The partitioned testbenches are generated based on the full testbench 306 and the partitioned netlists 302 or information extracted therefrom. A second file containing such extracted information may be created for each partition (206). For example, each of the partitioned netlists is examined so as to find the primary inputs and scan inputs that are inputs to the logic cones, and the logic cone outputs and any primary outputs in the partition. Thus, the second file contains information of both input signals and output signal of each of the logic cones within the partition. The output signal of a logic cone is either a data input signal to the cone-output scan circuit, which is to be captured by that scan circuit as a logic cone output, or a primary output signal of the IC design. The input signals of a logic cone are output signals (having assigned/controlled values) from other scan circuits and/or primary input signals to the IC design.

A partitioning tool may be used to create the partitioned testbench from the full testbench using the second file as an input data file. The partitioning process includes deriving the test vectors for each partitioned testbench, where the test vectors include input values and the expected output values for the logic cones. The partitioned test benches 308 may be stored in a database.

Then, the entire testbench is verified by simulating the partitioned testbenches 308 on the corresponding partitioned netlists 304 (210). The verification process may include applying the input values (of the test vector) to the partitioned netlist and obtain simulated output values, and comparing the simulated output values with the expected output values. The partitioned testbench stimulates only cone logic inputs to a specific partition, and observes only cone outputs in that partition. The partitioned testbench may read the same test vectors as the original full testbench, but discard those input and output values not used in the given partition. The partitioned testbench provides the same debug messages as the original testbench. Any mismatch between the simulated values and the expected output values may be reported (212). If there are no mismatches between the observed and expected values, that partition passes the verification. If there are any mismatch, the partitioned testbench must be debugged for the corresponding partitioned netlist.

In accordance with one embodiment of the present invention, the verification of the partitioned testbenches is performed in parallel, and the verification processes may be assigned to a set of machines. For example, the partitioned test benches run in parallel on a multiple processor system such as that referred to as a server ranch or compute ranch, or other parallel computing engine. Such assignment may be based on performance of the respective machine.

Figure 7:
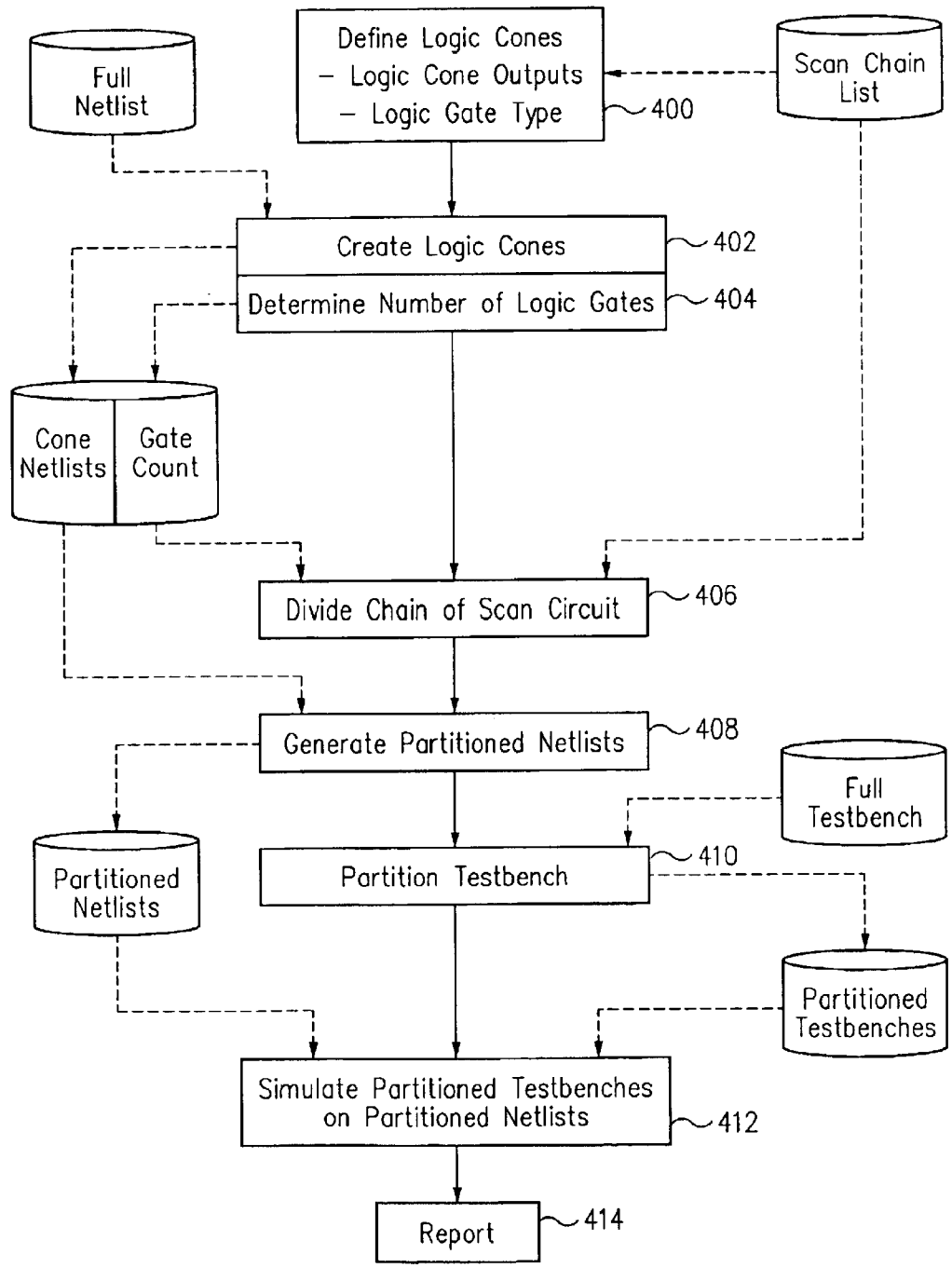
FIG. 7 is a diagram schematically illustrating a method for partitioning a testbench for verification in accordance with one embodiment of the present invention.

FIG. 7 schematically illustrates a method for partitioning a testbench for verification in accordance with one embodiment of the present invention. The testbench is adapted to test an IC design including a chain of scan circuits having a memory characteristic. The IC design receives primary inputs and producing primary outputs, as shown in FIGS. 3 and 4: In this embodiment, logic cones are generated prior to dividing the scan circuit, and the scan chain is divided into partitions such that each partition includes a substantially equal number of logic gates. The scan chain may also be divided such that each partition includes a substantially equal number of logic cones.

As shown in FIG. 7, first, logic cones are defined with their output and a specific type of logic gate (400). As described above, a logic cone extends from a logic cone output to one or more logic cone inputs. The logic cone output is one of the scan circuits or one of the primary outputs, and the logic cone input is one of the scan circuits or one of the primary inputs. Then, by tracing back the logic cones as described above, the logic cones (cone netlists) are created from the full netlist of the IC design (402). In this process, the number of logic gates included in each logic cone is also determined (404). Then, the chain of scan circuits is divided into a plurality of partitions (406) based on the number of logic gates such that each partition includes a substantially equal number of logic gates.

There are two reasons for making the number of logic gates of the partitions uneven. The first reason is that since each logic cone has a certain number of logic gates, a set of logic cones in one partition does not yield exactly the same number of logic cones as that of another partition having a different set of logic cones. The second reason is that there is overlap of logic gates across two or more logic cones. That is, if a first logic cone has m logic gates and a second logic cone has n logic gates, the partition including the first and second logic cones will have p logic gates where p<m+n. However, such overlap is preferable, since it reduces the simulation time.

To keep the variation in the number of logic gates per partition small the following procedure may be employed. First, a specific number of logic gates is selected for the dividing process, and the process may start with a scan circuit (i.e., a corresponding logic cone) and add adjacent scan circuits on the scan chain until the total logic gate count reaches or exceeds the specific number. Alternatively, the closer of the numbers below and excess the specific number of logic gates may be chosen. The specific number of the logic gates may be selected by dividing the total number of logic gates by the desired number of the partitions. Also, any other schemes that reduce or minimize the variation in the number of logic gates among the partitions may be used. The primary outputs as logic cone outputs are handled in the same manner as the scan circuits.

A partitioned netlist is generated for each partition by combining logic cone netlists corresponding to the scan circuits therein (408). Non-scan circuit logic cones, i.e., logic cones having the primary outputs as their logic cone outputs, are also added to the partitioned netslits. By conducting the process for all partitions, the partitioned netlists are produced. During this process, the information of logic cone outputs and logic cone inputs for each partition (such as the second file described above) is also extracted.

Once the partitioned netlists and the necessary information are obtained, the partitioned testbenches are generated from the full testbench (410), and the verification process is performed by simulating the partitioned testbenches on the corresponding partitioned netlists (412) in the same manner as the previous embodiment. Any mismatch between the simulated values and the expected values may be reported (414).

FIG. 8 illustrates in a tabular form an example of result of the parallel testbench partitioning and verification executed on a large circuit block of an application specific integrated circuit (ASIC) in accordance with one embodiment of the present invention. In this example, the circuit design is partitioned into thirty blocks, and each block (except the last one) includes an equal number of scan circuits (flip-flops). A high fault coverage test was generated for the complete circuit block, and the block was verified using the full functional testbench using a Verilog simulation tool, for example, Verilog-XL® Simulator, available from Cadence Design Systems, Inc. of San Jose, Calif., for comparison. Then each partition was verified. Both of the CPU time for the simulation and the number of accelerated events are captured for each case. Although the results do not contain the compile time, there was also a reduction in the compile time.

The complete netlist took 29,294.2 seconds to simulate (8.13 hours) and involved 1,514,430,366 simulated events. FIG. 8 provides results for each partition, including run time, speedup over the full testbench case, number of accelerated events, and improvement in event count from the full testbench case. Runtime speedups range from a low of 14.5 times to a high of 83.45 limes. The run time improvement is better than linear on the average (a 51.47 times speedup compared with the linear improvement of 30 times). However, it should be noted that this result is by way of example and is not intended to be exhaustive or limiting in any way.

As described above, the scan chains are used as partitioning points of the netlist and the testbench. The scan circuits are partitioned into groups. For each group, cones of logic are extracted, which end each scan circuit as the cone output and begin at either primary inputs to the circuit or other scan circuits. The full netlist of the circuit is also partitioned based on these logic cones. Then, the testbench produced by an ATPG or BIST tool is partitioned into partitioned testbenches each of which contains only stimuli driving logic gates in the corresponding partition. The partitioned testbenches are simulated with the partitioned netlists. If all partitions pass (i.e., the results of the simulation match the expected values in the partitioned testbench) then the full testbench passes the verification test. Since both the netlist of the circuit under test and the testbench are partitioned into smaller pieces, logic simulation on them for verification can run more rapidly, reducing the amount of time needed to verify the correctness of the test patterns. Also, the verification task can be distributed across a network of machines.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for verifying a testbench for an integrated circuit (IC) design, the IC design including a chain of scan circuits having a memory characteristic, said method comprising:

dividing the chain of scan circuits and creating a plurality of partitions, each partition including at least one logic cone output, each scan circuit belonging to one of the partition as a logic cone output;

generating a partitioned netlist for each partition from a full netlist for the IC design, the partitioned netlist including at least one logic cone, the logic cone extending from the logic cone output to at least one logic cone input;

generating a partitioned testbench for each partition from the full testbench based on the partitioned netlists; and performing verification for the testbench by simulating the partitioned testbenches on the corresponding partitioned netlists;

wherein said generating the partitioned netlist includes:

creating a logic cone for each partition, including:

defining the logic cone with an output signal thereof;

defining a specific type of logic gates providing logic cone inputs;

determining a first logic gate for which the output signal is an output;

tracing back an input signal of the first logic gate to a second logic gate driving the input signal;

recursively tracing back an input signal of the second logic gate until the input signal is a primary input to the IC design or a third logic gate driving the input signal to the second logic gate is of the specific type; and collecting all of the logic gates and signals traced back from the first logic gate to the primary input or to the logic gate of the specific type.

2. A method for partitioning a parallel testbench for verification, the testbench being adapted to test an integrated circuit (IC) design including a chain of scan circuits, the scan circuits having a memory characteristic, said method comprising:

dividing the chain of scan circuits and creating a plurality of partitions, each partition including at least one logic cone output, each scan circuit belonging to one of the partitions as a logic cone output;

defining a logic cone with an output signal thereof;

defining a specific type of logic gates providing logic cone inputs;

creating a first file for each partition, the first file including:

information of an output of each logic cone within the partition; and information of the specific type of logic gates;

generating a partitioned netlist for each partition based on a full netlist for the IC design and the first file, the partitioned netlist including at least one logic cone;

creating a second file for each partition based on the partitioned netlists, the second file including:

information of an output signal of each logic cone within the partition; and information of inputs signals to each logic cone within the partition; and partitioning the testbench based on the second file so as to generate a partitioned testbench for each partition;

wherein said generating the partitioned netlist includes:

determining a first logic gate for which the output signal is an output;

tracing back an input signal of the first logic gate to a second logic gate driving the input signal;

recursively tracing back an input signal of the second logic gate until the input signal is a primary input to the IC design or a third logic gate driving the input signal to the second logic gate is of the specific type; and collecting all of the logic gates and signals traced back from the first logic gate to the primary input or to the logic gate of the specific type.

3. A method for partitioning a testbench for verification, the testbench being adapted to test an integrated circuit (IC) design including a chain of scan circuits, the scan circuits having a memory characteristic, the IC design receiving primary inputs and producing primary outputs, said method comprising:

defining a logic cone extending from a logic cone output to at least one logic cone input, the logic cone output being one of the scan circuits or one of the primary outputs, the logic cone input being one of the scan circuits or one of the primary inputs;

creating logic cones from a full netlist of the IC design and determining a number of logic gates included in each of the logic cones;

dividing the chain of scan circuits into a plurality of partitions based on the number of logic gates, each partition including at least one logic cone and having a substantially equal number of logic gates;

generating a partitioned netlist for each partition by combining corresponding logic cone netlists;

generating a partitioned testbench for each partition from the full testbench and the partitioned netlists; wherein said defining includes:

defining the logic cone with an output signal thereof; and defining a specific type of logic gates providing the logic cone inputs; further wherein said creating logic cones includes:

determining a first logic gate for which the output signal of the logic cone is an output;

tracing back an input signal of the first logic gate to a second logic gate driving the input signal;

recursively tracing back an input signal of the second logic gate until the input signal is a primary input to the IC design or a third logic gate driving the input signal to the second logic gate is of the specific type; and collecting all of the logic gates and signals traced back from the first logic gate to the primary input or to the logic gate of the specific type.

4. An apparatus for partitioning a testbench for verification, the testbench being adapted to test an integrated circuit (IC) design including a chain of scan circuits, the scan circuits having a memory characteristic, said apparatus comprising:

means for dividing the chain of scan circuits and creating a plurality of partitions, each partition including at least one logic cone output, each scan circuit belonging to one of the partition as a logic cone output;

means for generating a partitioned netlist for each partition from a full netlist for the IC design, the partitioned netlist including at least one logic cone, the logic cone extending from the logic cone output to at least one logic cone input; and means for generating a partitioned testbench for each partition from the full testbench based on the partitioned netlists;

wherein said means for generating the partitioned netlist includes:

means for creating a logic cone for each partition, including:

means for defining the logic cone with an output signal thereof;

means for defining a specific type of logic gates providing logic cone inputs;

means for determining a first logic gate for which the output signal is an output;

means for tracing back an input signal of the first logic gate to a second logic gate driving the input signal;

means for recursively tracing back an input signal of the second logic gate until the input signal is a primary input to the IC design or a third logic gate driving the input signal to the second logic gate is of the specific type; and means for collecting all of the logic gates and signals traced back from the first logic gate to the primary input or to the logic gate of the specific type.

5. An apparatus for partitioning a testbench for verification, the testbench being adapted to test an integrated circuit (IC) design including a chain of scan circuits, the scan circuits having a memory characteristic, the IC design receiving primary inputs and producing primary outputs, said apparatus comprising:

means for defining a logic cone extending from a logic cone output to at least one logic cone input, the logic cone output being one of the scan circuits or one of the primary outputs, the logic cone input being one of the scan circuits or one of the primary inputs;

means for creating logic cones from a full netlist of the IC design and determining a number of logic gates included in each of the logic cones;

means for dividing the chain of scan circuits into a plurality of partitions based on the number of logic gates, each partition including at least one logic cone and having a substantially equal number of logic gates;

means for generating a partitioned netlist for each partition by combining corresponding logic cone netlists; and means for generating a partitioned testbench for each partition from the full testbench and the partitioned netlists; wherein said means for defining includes:

means for defining the logic cone with an output signal thereof; and means for defining a specific type of logic gates providing the logic cone inputs; further wherein said means for creating logic cones includes:

means for determining a first logic gate for which the output signal of the logic cone is an output;

means for tracing back an input signal of the first logic gate to a second logic gate driving the input signal;

means for recursively tracing back an input signal of the second logic gate until the input signal is a primary input to the IC design or a third logic gate driving the input signal to the second logic gate is of the specific type; and means for collecting all of the logic gates and signals traced back from the first logic gate to the primary input or to the logic gate of the specific type.

* * * * *